United States Patent [19]
Jankowski et al.

[11] Patent Number: 5,753,385
[45] Date of Patent: May 19, 1998

[54] HYBRID DEPOSITION OF THIN FILM SOLID OXIDE FUEL CELLS AND ELECTROLYZERS

[75] Inventors: Alan F. Jankowski; Daniel M. Makowiecki; Glenn D. Rambach, all of Livermore, Calif.; Erik Randich, Endinboro, Pa.

[73] Assignee: Regents of the University of California, Oakland, Calif.

[21] Appl. No.: 573,508

[22] Filed: Dec. 12, 1995

[51] Int. Cl.$^6$ ............... H01M 8/10; H01M 4/86; H01M 4/90; H01M 6/18
[52] U.S. Cl. ............ 429/44; 429/33; 429/40; 429/45; 429/46; 429/193; 204/290 R; 204/242
[58] Field of Search ............... 429/33, 40, 44, 429/45, 46, 193; 204/290 R, 242; 427/77, 78, 115, 255.3

[56] References Cited

U.S. PATENT DOCUMENTS

| | | | |
|---|---|---|---|
| 5,217,822 | 6/1993 | Yoshida et al. | 429/40 |
| 5,350,641 | 9/1994 | Mogensen et al. | 429/33 |
| 5,403,461 | 4/1995 | Tuller et al. | 204/252 |
| 5,509,189 | 4/1996 | Tuller et al. | 29/623.1 |
| 5,589,285 | 12/1996 | Cable et al. | 429/13 |

FOREIGN PATENT DOCUMENTS

93/01130  1/1993  WIPO.

OTHER PUBLICATIONS

A.F. Jankowski et al., Sputter Deposition Of Yttria-Stabilized Zirconia Onto A Porous Au Substrate, J. Vac. Sci. Technol. A 13(3), May/Jun. 1995.
A.F. Jankowski et al., Reactive Sputter Deposition Of Yttria-Stabilized Zirconia, UCRL-JC-118652 (1995).
Jankowski et al. (J. VAc. Sci. Technol. A 13(3), May/Jun. 1995, Sputter Deposition of yttria-stabilized zirconia onto a Porous Au Substrate) 1995.

*Primary Examiner*—Kathryn L. Gorgos
*Assistant Examiner*—Alex Noguerda
*Attorney, Agent, or Firm*—L. E. Carnahan; Henry P. Sartorio

[57] ABSTRACT

The use of vapor deposition techniques enables synthesis of the basic components of a solid oxide fuel cell (SOFC); namely, the electrolyte layer, the two electrodes, and the electrolyte-electrode interfaces. Such vapor deposition techniques provide solutions to each of the three critical steps of material synthesis to produce a thin film solid oxide fuel cell (TFSOFC). The electrolyte is formed by reactive deposition of essentially any ion conducting oxide, such as defect free, yttria stabilized zirconia (YSZ) by planar magnetron sputtering. The electrodes are formed from ceramic powders sputter coated with an appropriate metal and sintered to a porous compact. The electrolyte-electrode interface is formed by chemical vapor deposition of zirconia compounds onto the porous electrodes to provide a dense, smooth surface on which to continue the growth of the defect-free electrolyte, whereby a single fuel cell or multiple cells may be fabricated.

19 Claims, 2 Drawing Sheets

HYBRID DEPOSITION OF THIN FILM SOLID OXIDE FUEL CELLS AND ELECTROLYZERS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to solid oxide fuel cells, particularly to thin film solid oxide fuel cells, and more particularly to the fabrication of thin film solid oxide fuel cells using vapor deposition techniques to miniaturize the assembly thereof for the formation of single and multiple cells.

Fuel cells are electrochemical devices that convert the chemical energy in hydrogen or carbon monoxide and oxygen (in air) to electricity. A solid oxide fuel cell (SOFC) consists of three basic components: an electrolyte separating an anode and cathode. A thin film solid oxide fuel cell (TFSOFC) offers improvements in cost, reliability, efficiency, power density and specific power over other fuel cells.

An option to eliminate emissions from vehicles, reducing dependence on oil and enabling the use of alternative fuels, is the development and commercialization of fuel cells that are cost effective, safe, and reliable. The maturation of vacuum coating technology in the microelectronics and photovoltaics industries has enabled the potential manufacture of thin film solid fuel cells (TFSOFCS) at costs less than any other current fuel cell design and possibly as low as the unit cost of internal combustion engines. Whereas current SOFC designs, based on state-of-the-art ceramic powder engineering require a 1000° C. operation. TFSOFCs can operate at temperatures less than 750° C. with a dramatically reduced volume and mass for a given power output.

The reduction in operation temperature enables the alternative selection of materials for the greatly reduced dimensions of thin films as opposed to the SOFCs synthesized with bulk ceramic methods. Herein lie the difficulties encountered in TFSOFC synthesis and original solutions to the following problems.

The electrolyte must have sufficient mechanical integrity to survive fabrication and operational environments. The electrolyte must be a thermodynamically stable oxide layer on the order of 1–10 µm thick with a good oxygen ion transference number, low electron conductivity, and high enough density to prevent the fuel and air mixing. Yttria stabilized zirconia (YSZ) and cerium oxide ($CeO_2$), for example, are candidate materials, but they have not been synthesized in sub 10 µm thick, defect-free layers. Essentially, any other ion conducting oxides can be used.

The electrodes must be mechanically strong with a coefficient of thermal expansion (CTE) that matches the electrolyte and must be electrically conductive, yet sufficiently porous to allow for gas flow there through. Prior attempts to vapor synthesize a metal doped, YSZ layer which is porous have been unsuccessful. In addition, the electrolyte-electrode interface must be structurally stable and supply sufficient line contact for the dissociation-recombination reactions as well as ionizations and ion penetrations-extractions.

SUMMARY OF THE INVENTION

It is an object of the present invention to provide a thin film solid oxide fuel cell.

A further object of the invention is to provide thin film solid oxide fuel cell electrodes, and thin film solid oxide electrolyzers using hybrid deposition techniques.

A further object of the invention is to utilize hybrid deposition techniques for the formation of an electrolyte, electrodes, and electrolyte-electrode interfaces for thin film solid oxide fuel cells and electrolyzers.

Another object of the invention is to utilize reactive magnetron deposition of ion conducting oxides, such as defect free yttria stabilized zirconia films, and defect free gadolinium doped cerium oxide films, of less than 10 µm thickness, for example, for use as electrolytes.

Another object of the invention is to magnetron sputter coat ceramic powders with an appropriate metal and sinter to a porous compact for use as anodes and cathodes.

Another object of the invention is to utilize chemical vapor deposition of zirconia compounds onto porous ceramic members to provide a dense, smooth surface on which to enable an effective electrolyte-electrode interface for single or multiple fuel cells.

Another object of the invention is to provide a controlled change in chemical vapor deposition flow parameters which enables high-rate deposition of alternate porous and dense yttria stabilized zirconia (with in-situ metal infiltration into the porous layers to form electrodes) resulting in the stacking of solid oxide fuel cell units through a continuous process.

Other objects and advantages of the present invention will become apparent from the following description and accompanying drawings. Basically, the invention involves a thin film solid oxide fuel cell (TFSOFC) produced by hybrid deposition techniques utilizing physical vapor deposition (PVD), such as magnetron sputtering, and chemical vapor deposition (CVD) to produce the electrolyte and electrodes, and the electrolyte-electrode interface. In addition, the invention involves controlling the CVD flow parameter to produce porous or dense layers, and infiltration of metal into the porous layers, to provide stacking of fuel cell units through a continuous process. The use of vapor deposition techniques enables synthesis of the basic components of a solid oxide fuel cell (SOFC), which are 1) the electrolyte layer, 2) the two electrodes, and 3) the electrolyte-electrode interfaces.

The fabrication process involves synthesis of an electrolyte layer less than 10 µm thick of yttria stabilized zirconia (YSZ) for low temperature operation (<750° C.). The YSZ electrolyte structure is crystalline as well as dense and defect free, and formed by reactive magnetron deposition. The electrodes consist of a porous matrix which is electrically conductive and composed, for example, of metal coated YSZ powder, formed by magnetron sputtering, and thereafter sintered to form a porous compact with continuous porosity, e.g with 55-25% porosity. The electrolyte-electrode interface is formed by chemical or physical vapor deposition of zirconia compound onto the porous electrodes to form a smooth dense surface on the electrode surfaces. The electrolyte and electrodes may be solid-state bonded together or formed in a continuous manner by control of the PVD and CVD techniques.

BRIEF DESCRIPTION OF THE DRAWINGS

The accompanying drawings, which are incorporated into and form a part of the disclosure, illustrate an embodiment of the invention and methods of fabrication and, together with the description, serve to explain the principles of the invention.

DETAILED DESCRIPTION OF THE INVENTION

Figure 1:
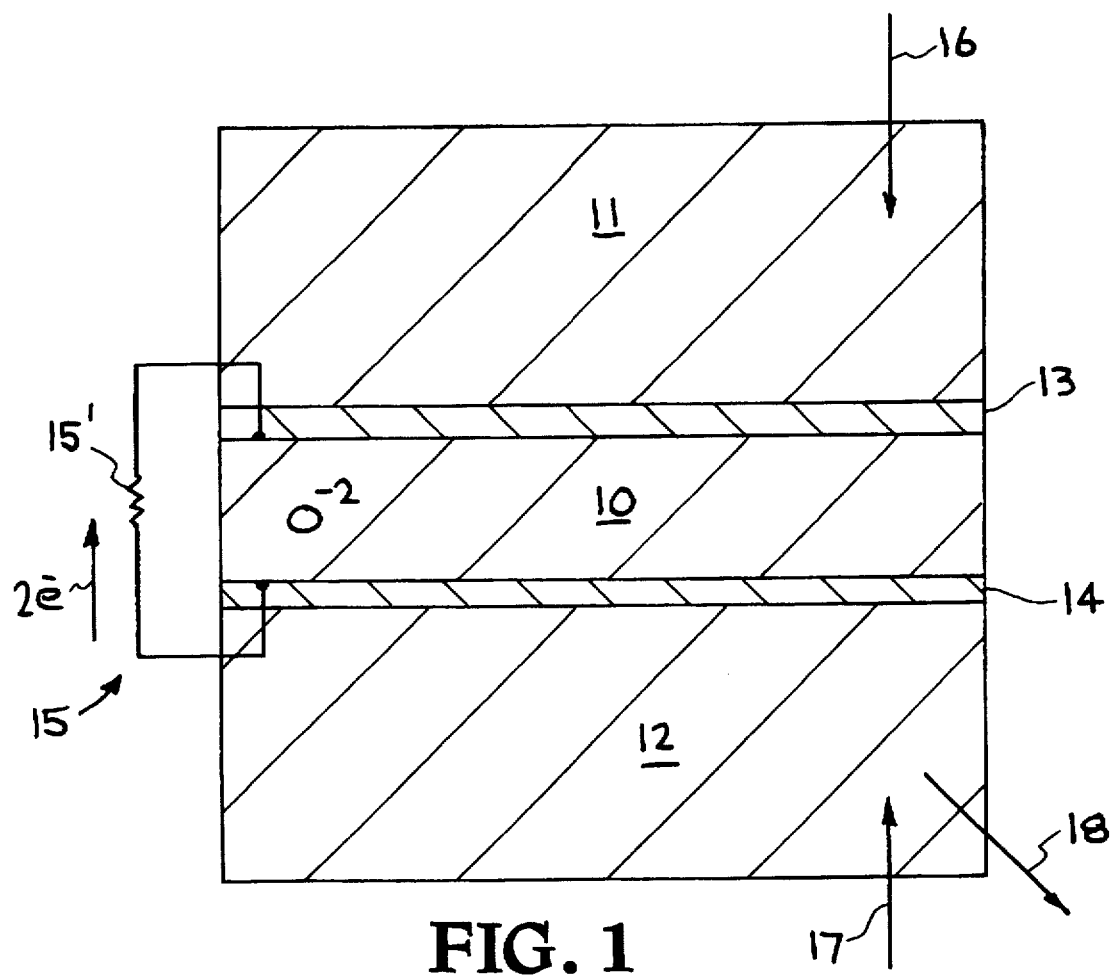
FIG. 1 is a cross-sectional view of an embodiment of a thin film solid oxide fuel cell made in accordance with the invention.

The invention involves hybrid deposition of thin film solid oxide fuel, electrodes, cells and electrolyzers. A solid oxide fuel cell (SOFC) consists of three basic components: an electrolyte separating an anode and a cathode. Vapor deposition techniques will independently and uniquely provide solutions to each of the three critical components by materials synthesis needed to produce a thin film solid fuel cell (TFSOFC). Advantageous use of thin film deposition technology serves to miniaturize the assembly and reduce the cost of SOFCs, thereby revolutionizing potential applications. The invention involves three basic operations: 1) formation of an electrolyte, 2) formation of electrodes, and 3) formation of electrolyte-electrode interfaces. In a first technique, reactive deposition of defect free yttria stabilized zirconia (YSZ) films less than 10 μm thick for use as electrolytes is accomplished through the reactive sputtering of yttrium-zirconium alloy targets with planar magnetrons. In a second technique, ceramic powders are sputter coated with an appropriate metal, compacted and sintered into a porous compact in a plate geometry for use as anodes and cathodes. Alternatively, the electrodes are formed by a co-deposition of sputtering the metal appropriate for the anode (or cathode) with sputtering of an oxide material (e.g. zirconia) whose coefficient of thermal expansion (CTE) matches the electrolyte layer (e.g. yttria-stabilized zirconia). In a third technique, chemical vapor deposition of zirconia compounds onto the porous ceramic compacts provides a dense, smooth surface for bonding to the electrolyte, or on which to continue the growth of the defect free electrolyte for stacking of SOFC units through a continuous process. The electrolyte-electrode interfaces must be structurally stable and supply sufficient line contact for the dissociation-recombination reactions as well as ionizations and ion penetrations-extractions.

As pointed out above, the invention involves the use of vapor deposition techniques which enable synthesis of the basic components of a SOFC; namely, the electrolyte layer, the two electrodes, and the electrolyte-electrode interfaces. As described in detail hereinafter, the first two of the above-identified components are produced using physical vapor deposition (PVD) with planar magnetrons, and the last one of the above-identified components is produced using chemical vapor deposition (CVD). Thus, the present invention involves hybrid deposition of thin films for producing solid oxide fuel cells, electrodes and electrolyzers, and which overcome the problems associated with prior efforts to produce TFSOFCs having a thermodynamically stable electrolyte of a thickness of less than 10 μm; electrodes which are mechanically strong, electrically conductive, and with a coefficient of thermal expansion that matches the electrolyte, yet porous enough to allow for gas flow; and an electrolyte-electrode interface that is structurally stable and sufficiently smooth to enable the reactions and ionizations which occur.

Synthesis of an electrolyte layer less than 10 μm thick of yttria stabilized zirconia (YSZ) is necessary for the low temperature operation (<750° C.) of a TFSOFC. The structure of the YSZ layer is crystalline as well as dense and defect free, i.e. there are no continuous voids through the film thickness. This is accomplished by the use of reactive deposition of a metal alloy target of ZrY (~85 at. % Zr) onto a temperature controlled substrate (temperature of 600° to 750° C.).

The electrodes consist of a porous matrix which is electrically conductive. Utilizing one fabrication technique of the present invention, YSZ powder (~1 μm size) is sputter coated with metal (Ni for the anode and Ag for the cathode) then compacted and sintered to form a 50% porous compact in a plane geometry (<1.5 mm thick). This procedure has proven successful and leads to significantly less expensive thin cathodes than the currently used strontium-doped lanthanum manganite. More generally, porosity ranging from about 55% to about 25% is desired. The upper limit for porosity is dictated by structural strength requirements while the lower limit is the result of the inability to form less porous bodies.

Alternatively, growth of either the anode or cathode can continue from deposition of the electrolyte layer by co-sputtering the appropriate metal, e.g. Ni for the anode and Ag for the cathode. In this way, a unit cell can be vapor deposited in a continuous process. For both the coated powder and continuous deposition methods of electrode synthesis, the metal content of the electrode is less than 15% by volume. The low metal content (as compared to 30–50% as used in bulk cermets) provide a coefficient of thermal expansion for the electrode that matches the electrolyte layer ensuring a composite structure which is thermally stable and not as susceptible as the bulk cermet electrode-based fuel cell to failure by thermal shocking and cycling.

Vapor deposition of zirconia onto a porous substrate is pursued to create a smooth dense surface on the electrode layer on which to continue deposition of the YSZ electrolyte layer either through chemical vapor deposition (CVD) or physical vapor deposition (PVD). The viscous flow of the CVD process (at higher pressures than that conventionally used for sputtering) uniquely enables near surface filling of the porous compact to a dense overlayer. A controlled change in the CVD flow parameters enables high-rate deposition of alternate porous and dense YSZ layers (with in-situ metal infiltration into the porous layers to form electrodes) resulting in the stacking of SOFC units, also through a continuous process.

Upon successful completion of the above described three tasks or operations, the assembly of a TFSOFC is approached in the following two ways. The first is to bond at elevated temperature the YSZ electrolyte to the porous compact electrodes. Since reaction rates are high at operating temperature, catalysis of fuel and air between the electrode and electrolyte is limited to the interface region of linear contact. This assembly process is carried out to produce the embodiment of FIG. 1. The second method of cell assembly (similar to that described above relative to CVD process) begins by utilizing the CVD infiltration of the 1–2 μm top region of the porous electrode to increase the area of contact to the overgrowth YSZ electrolyte layer for catalysis of fuel and air, and whereafter the other electrode is formed.

As seen from the above general description of the invention the TFSOFCs can be fabricated and/or assembled using two different approaches, each involving hybrid deposition techniques. An embodiment of a TFSOFC produced by PVD is illustrated in FIG. 1, and comprises a layer of electrolyte 10 having on opposite sides electrodes 11 and 12 which include thin electrolyte-electrode interface layers 13 and 14. The opposite sides of the electrode 10 are shown interconnected via an electrical load, e.g. circuit 15 including a resistor 15', with an arrow 16 indicating oxygen (air) an arrow 17 indicating hydrogen (fuel), and an arrow 18 indicating water. The electrolyte 10 has a thickness of less than 10 µm and composed of crystalline YSZ, with electrode 11 having a thickness of up to 500 µm and composed of Ag coated YSZ power, with electrode 12 having a thickness of up to 500 µm and composed of Ni coated YSZ powder, and interface layers 13 and 14 having a thickness of 1–2 cm and composed of YSZ or $ZrO_2$. The electrolyte ionic behavior and physical integrity can be enhanced by forming the structure as a multilayer process.

The following sets forth a detailed operational sequence for fabrication and assembly of the embodiment illustrated in the drawing, which is carried out as follows:

The electrolyte layer (10) can be formed using sputtering deposition. For the use of yttria-stabilized zirconia as the electrolyte, both rf sputtering from a stoichiometric target and reactive sputtering of a zirconium-yttrium metal alloy target are used.

1. The physical vapor deposition of 1–10 µm thick films of yttria-stabilized zirconia (YSZ) is approached through 13.56 MHz rf-sputtering a target of $(Y_2O_3)_6(ZrO_2)_{94}$. The deposition chamber is cryogenically pumped from atmospheric pressure to a base pressure of $<6 \times 10^{-6}$ Pa in 12 hrs. including a 4 hr., 100° C. bake out. Room (20°–30° C.) to elevated (<750° C.) substrates (i.e. the electrodes) are horizontally positioned 3–10 cm away from the center of the YSZ target. The Ar sputter gas pressure is regulated from 0.4 to 5 Pa (3 to 38 mTorr) at a constant flow rate. The sputter gas pressure used to initiate the YSZ deposit is selected to maximize contact area over the porous substrate surface. Low sputter gas pressures (<2 Pa) favor energetic sputtered neutrals and line-of-sight deposition. High sputter gas pressures (>5 Pa) favor low surface mobility and very high scattering. Therefore, to promote the filling of voids in the porous substrate, the YSZ is initially sputtered at a gas pressure of 3–5 Pa (22–38 mTorr) to form either the electrolyte-cathode interfacial layer (13) for the case of deposition onto a cathode substrate or the electrolyte-cathode interfacial layer (14) for the case of deposition onto an anode substrate. The gas pressure is then reduced to promote a dense film growth in the bulk of the electrolyte layer (10). The electrolyte film is grown to be free of pinhole defects that would allow an uncontrolled mixing of the oxidant (16) with the fuel (17). A post deposition air anneal of the electrolyte film can be performed to stabilize the desired cubic crystallographic phase in the sputtered deposit, e.g. the zirconia films are heated in air to 700°±3° C. at a rate of 15°–17° C. min.$^{-1}$, held at temperature for 1 hr. then cooled to room temperature.

2. Yttria-stabilized zirconia (YSZ) films are synthesized using reactive dc magnetron sputter deposition. A homogeneous alloy of Zr—Y is processed into a planar magnetron target by rolling an alloy button. The Zr—Y button is first formed by electron beam arc melting a total mass ratioed as 489 gms of Zr to 86 gms of Y in order to produce an alloy composition of 15 atomic percent Y. When appropriately oxidized, the resulting yttria-stabilized zirconia stoichiometry is $(Y_2O_3)_{0.02}(ZrO_2)_{0.92}$. This 8% yttria composition (as compared to 5–6% as conventionally used in oxide target synthesis) yields the optimum oxygen ion conductivity for cubic YSZ at elevated temperatures. The deposition chamber is cryogenically pumped from atmospheric pressure to a base pressure of $<6 \times 10^{-6}$ Pa in 12 hrs. which includes a vacuum bake-out at 250° C. for 2–4 hours. The Zr—Y target is sputtered with an Argon-Oxygen gas mixture to reactively form 0.5–10 µm thick Zr—Y—O films. The deposition parameters of current density, substrate temperature, working gas pressure and flow are determined in order to produce the cubic YSZ phase at high rate. High rate deposition is relative to process conditions where the target sputters in a metallic-mode as opposed to the low yield oxide-mode. At a target power (P) of 170 Watts and gas pressure (p) of 0.67 Pa (5 mTorr), a deposition rate hysteresis with gas flow (q) is determined in order to define a specific flow for which both the oxide- and metallic- modes of target sputtering can be achieved. Selection of a specific flow will then allow for a near continuous variation of oxygen content in the forming film as a function of target power, i.e. current density which is proportional to the sputter deposition rate. The variation of oxygen composition in the deposited film as a function of deposition rate has been shown for the reactive sputtering of Mo and Y metal targets. The initial hysteresis deposition experiment leads to the selection of a nominal gas flow with which to then conduct further deposition experiments to evaluate the dependency of oxygen content on deposition rate. The substrate temperature is controlled and varied by inductive heating to 700° C., the nominal operating temperature of a thin film YSZ-based fuel cell. The variation of gas pressure to initially fill surface voids then stabilize a pinhole free growth of the electrolyte layer follows as described for the rf sputter deposition process that utilizes a stoichiometric YSZ target composition.

3. The use of compositionally different electrode-electrolyte interfacial layers (13 and 14) can also be added to enhance performance of the unit fuel cell by reducing interfacial reaction resistances during the generation of electrical current at operating potential (15). For example, it is common knowledge that Y-stabilized $Bi_2O_3$ can be used at the cathode side and Y-doped $CeO_2$ can be used at the anode side.

The electrodes (11 and 12) may also be synthesized through compaction of metal coated powders, as described hereinafter.

4. Stabilized zirconia powder is metal coated, with Ag for the cathode (11) and Ni for the anode (12), then compacted and sintered (or alternatively, hot pressed) to form porous electrode wafers which will serve as platforms (i.e. substrates) for the electrolyte deposition previously described and for ensuing cell fabrication. The electrode wafers are composites which consist of metal-coated powder that provide both electrical conductance and whose controlled porosity enables the passage of either fuel for the anode (12) or air for the cathode (11). This approach potentially eliminates the need for conductive porous supports. Conventionally, appropriate metals are sintered with YSZ powder to form conductive but brittle electrodes which then require structural support as well as fuel/air flow passages. In addition, the composition of the conventional electrodes usually requires so much metal (>20% by volume) that the electrodes are no longer coefficient thermal expansion (CTE)-matched with the electrolyte layer. The method of this invention of electrode synthesis minimizes the use of metallization in the anode and cathode to form a conductive matrix which encases the substantive mass consisting of stabilized-zircoria to CTE-match the electrolyte layer. Stabilized-zirconia powder has been coated with Ni using an intermediate metallization layer to ensure adhesion when thermal cycled. The deposition chamber is cryogenically pumped from atmospheric pressure to a base pressure of <5×10$^{-6}$ Pa in 12 hrs. which includes a vacuum bake-out. Zirconia or YSZ powders of <50 µm in size are first subjected to a high pressure (>6 Pa) plasma ashing process with He gas that remove hydrocarbons from the particle surface. The powder particles are next sputtered coated at ambient temperature. Initially, an adhesion layer of Cr metal and/or Ti metal that can be <0.1 to >0.31 µm thick is applied. The powders are subjected to a vibrational load during sputter coating which ensures random tumbling hence uniform coating of the surface for each powder particle. In a sequence of final powder metallizations, Ni is the coating for use as an anode whereas Ag is the coating for use as the cathode. The electrode metal thickness required is only 0.5–1 µm. The metal coated powders are cold pressed into wafers with compressive stresses of 10–40 ksi and then sintered for bonding at elevated temperatures (up to 1100° C.). The thermal history in the electrode processing ensures stability for use at nominal fuel cell operating temperatures of 700°–800° C.. Wafer forms of these electrodes have been produced as examples with diameters from 6 to 25 mm and thicknesses of 0.4 to 0.5 mm. The metal composes less than 10% of these electrodes by volume ensuring excellent thermal expansion and contraction behavior during temperature cycling.

As pointed out above, the TFSOFCs can be produced utilizing a continuation hybrid deposition process, and the following sets forth a specific example of such.

Figure 2A:
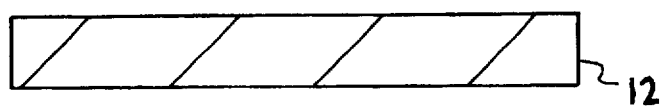
FIGS. 2A–2C illustrate a fabrication technique for producing the fuel cell of FIG. 1.

Several paths are used to form TFSOFCs. An example can be given utilizing the details of each process step as previously described. A continuous vapor deposition process utilizes multiple sources and a temperature controlled substrate platen. A source is provided for each constituent layer compound or to form each compound layer from elemental target/reactor materials depending on whether a PVD process as sputtering or a CVD process step is used. For simplicity, an example is given using solely magnetron sputtering, with reference to FIGS. 2a, 2b and 2c.

1. To start with, an anode 12 is formed, see FIG. 2a, wherein Ni and YSZ are co-sputtered from separate sources at elevated gas pressure to form a porous layer which contains a continuous matrix of metal. A removable base layer, not shown, is used for initiation of the deposition process.

2. An anode interfacial layer, similar to 14 in FIG. 1, is formed by halting the deposition of Ni and continuing with an elevated gas pressure deposition of YSZ and/or Y-doped CeO$_2$.

Figure 2B:
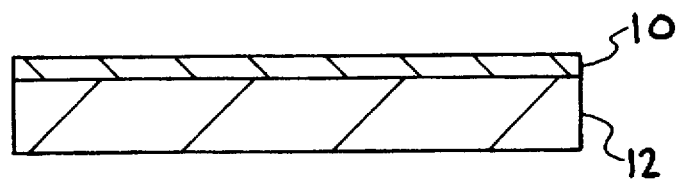

3. An electrolyte layer 10, as shown in FIG. 2b, is formed by continuing the sputter deposition of only YSZ at a low gas pressure.

4. The deposition process continues in formation of a cathode interfacial layer, similar to 13 in FIG. 1, by optional deposition of Y-stabilized Bi$_2$O$_3$.

Figure 2C:
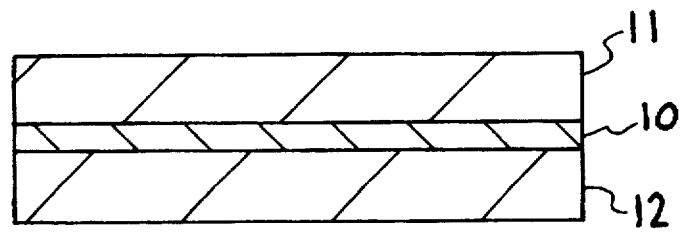

5. The formation of a cathode layer 11 as shown in FIG. 2c, then continues by co-sputter deposition from Ag and YSZ sources at elevated gas pressure to form the final porous layer.

The unit fuel cell built in steps 1–5 can be accomplished in a system composed of a stationary substrate with alternating deposition cycles or by passing a moving substrate through a deposition system with sequential reaction zones.

6. Alternatively, spacers and interconnect layers, such as Inconel, can be processed onto the unit cell sheet built in steps 1–5 using conventional lithographic patterning, deposition, and etching procedures.

7. A continuous sheet of unit fuel cell can then be cut and assembled into a fuel cell stack with processes used for conventional tape calendaring.

The step 7 option provides for maximum use of TFSOFC throughout the entire stack assembly by repeating steps 1–6. This option provides the maximum power density using TFSOFC technology.

8. Alternative paths to assembly of a unit cell described in steps 1–5 include, as shown in FIGS. 3a–3d, the use of metal coated powders as anode (12), FIGS. 3a and 3b and cathode (11), FIG. 3c, substrates on which to deposit interfacial layers, (14' and 13', respectively) and electrolyte layers 10' and 11", FIGS. 3b and 3c.

Figure 3A:
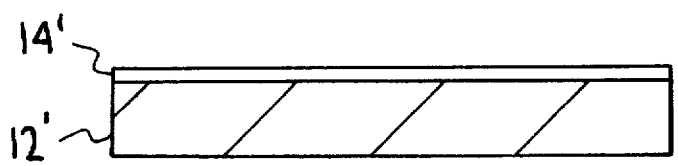
FIGS. 3A–3D illustrate another fabrication technique for forming to fuel cell of FIG. 1.
Figure 3B:
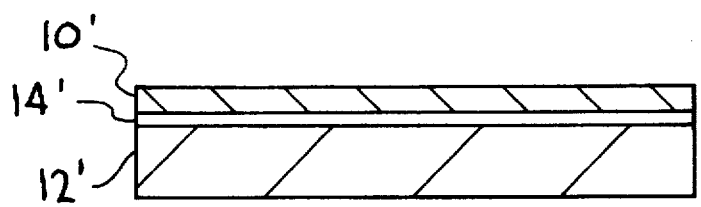
Figure 3C:
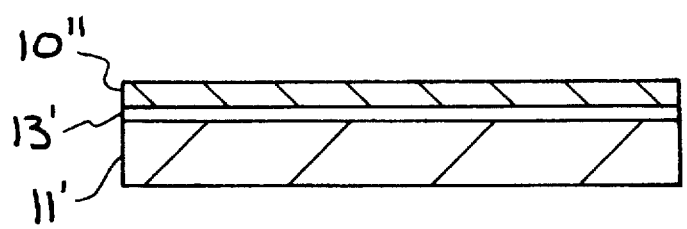
Figure 3D:
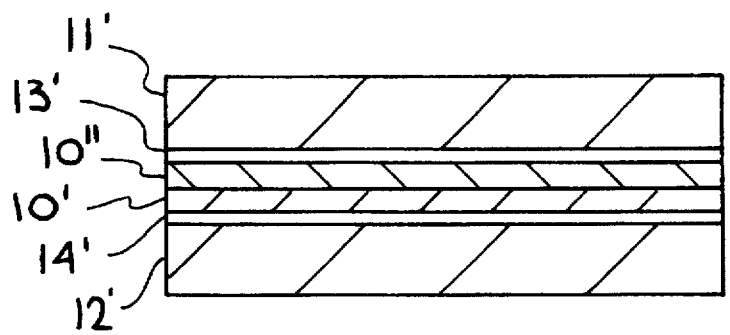

9. The electrolyte-electrode pair 10' and 10" can then be joined to its mate electrode by a sintering process to form a unit cell, as shown in FIG. 3d. This process produces a unit fuel cell taking advantage of the thinnest electrolyte layer and an intermediate reduction in electrode layer thickness as compared to bulk cermet processing. The electrolyte layer has a thickness of less than 10 µm and the electrodes may have a thickness of less than 750 µm.

10. Alternatively, CVD processing can be used for each sputtering process described above.

While the above embodiments have been described using YSZ or ZrO$_2$, essentially any ion conducting oxides, including CeO$_2$, can be used as the electrolyte. Also, the cathode, in addition to Ag may be composed of alternate noble metals, such as Pt or Pd, for example, or alternative compounds, such as lathanum-strontium-manganate, La(Sr)Mn$_3$, or La—Sr—Co—Fe alloys, for example, and the anode, in addition to Ni may be composed of alternative hydrogen compatible transition metals, such as cobalt, iron and Co—Fe alloys, for example.

It has thus been shown that the present invention provides for the fabrication and assembly of thin film solid oxide fuel cells and electrolyzers using hybrid deposition. By the utilization of magnetron sputtering a chemical vapor deposition technique, each of the three basic components of a TFSOFC are economically and effectively produced and assembled, while enabling operation of the TFSOFC at temperatures less than 750° C..

While the above embodiments have been set forth for low temperature applications, less than 750° C., the TFSOFC of FIG. 1 can be utilized for high temperature applications by changing the composition of the materials used. Where high temperature use is desired, the selection of the anode and the cathode metals must be chemically stable, as for example, using Pt.

While particular operational sequences, materials, temperatures, parameters, and a particular embodiment has been described and or illustrated, such is not intended to be limiting. Modifications and changes may become apparent to those skilled in the art, and it is intended that the invention be limited only by the scope of the appended claims.

The invention claimed is:

1. A solid oxide fuel cell comprising:

an electrolyte layer consisting of an ion conducting oxide;

a first porous electrode positioned adjacent one surface of said electrolyte layer and consisting of material selected from the group consisting of yttria stabilized zirconia and other material that matches the coefficient of thermal expansion (CTE) of the electrolyte, coated with a material selected from the group consisting of silver, platinum or palladium;

a second porous electrode positioned adjacent another surface of said electrolyte layer and consisting of material selected from the group consisting of yttria stabilized zirconia and other material that matches the CTE of the electrolyte, coated with a material selected from the group consisting of nickel, iron, cobalt, and Co—Fe alloys; and said porous electrodes having surfaces defining electrolyte-electrode interfaces located intermediate the electrolyte layer and said porous electrodes and consisting of material selected from the group consisting of yttria stabilized zirconia, and CeO.

2. The fuel cell of claim 2, wherein the electrolyte-electrode interfaces are formed in a 1–2 μm thick region of the surface of said electrodes.

3. The fuel cell of claim 1, wherein said electrolyte layer has a thickness of less than 10 μm.

4. The fuel cell of claim 1, wherein said electrodes have a thickness in the range of 1 to 750 μm.

5. The fuel cell of claim 1, wherein said electrolyte layer consists of crystalline yttria stabilized zirconia, wherein said first porous electrode consists of silver coated yttria stabilized zirconia, wherein said second porous electrode consists of nickel coated yttria stabilized zirconia, and wherein said interfaces consist of a zirconia compound.

6. The fuel cell of claim 1; wherein said first and second porous comprise a 55%–25% porous compact formed from powder coated with about 1 μm thick metal.

7. The fuel cell of claim 1, wherein said electrolyte-electrode interfaces define smooth surfaces on said first and second electrodes.

8. The fuel cell of claim 1, wherein said first and second porous electrodes are bonded to said electrolyte layer via said interfaces.

9. The fuel cell of claim 1, wherein said first and second porous electrodes are interconnected by a single layer of electrolyte.

10. The fuel cell of claim 1, wherein said porous electrodes have a metal content of less than 15% by volume.

11. The fuel cell of claim 1, wherein said electrolyte layer, said porous electrodes, and said electrolyte-electrode interfaces are constructed by a continuous deposition process.

12. A method for producing solid oxide fuel cells using continuous deposition, comprising:

forming an electrode having about 55%–25% porosity;

forming an electrode-electrolyte interface on at least one surface of the porous electrode;

forming an electrolyte on the interface;

forming an interface on the electrolyte; and forming an electrode on the interface.

13. The method of claim 12, wherein the sequence of operations are repeated to form a stacked solid oxide fuel cell.

14. The fuel cell of claim 13, wherein the sequence of forming operations is carried out using continuous deposition.

15. A solid oxide fuel cell produced by a continuous deposition process, comprising:

forming a first porous electrode;

forming a first electrode-electrolyte interface on a surface of the first porous electrode;

forming an electrolyte on the first interface;

forming a second electrode-electrolyte interface on the electrolyte; and forming a second porous electrode on the second interface.

16. The solid oxide fuel cell of claim 15, wherein the continuous deposition process additionally includes:

forming another electrode-electrolyte interface on one or both of said porous electrodes;

forming an electrolyte layer on one or both of the thus formed another interface; and forming an electrode-electrolyte interface on one or both electrolyte layers; and forming a porous electrode on one or both of the thus formed electrode-electrolyte interfaces.

17. The solid oxide fuel cell of claim 16, wherein the continuous deposition process additionally includes repeating the sequence of forming operations to produce a stacked solid oxide fuel cell.

18. Belt The solid oxide fuel cell of claim 15, wherein the forming of the porous electrodes is carried out such that the porous electrodes are formed with a porosity of about 25–55%.

19. The solid oxide fuel cell of claim 15, wherein the forming of the porous electrodes is carried out to produce the electrodes with a metal content of less than 15% by volume.

* * * * *